(12) United States Patent
Kasturi

(10) Patent No.: US 11,081,963 B2
(45) Date of Patent: Aug. 3, 2021

(54) SLOPE DETECTION AND CORRECTION FOR CURRENT SENSING USING ON-STATE RESISTANCE OF A POWER SWITCH

(71) Applicant: Infineon Technologies Austria AG, Villach (AT)

(72) Inventor: Prasan Kasturi, Sharon, MA (US)

(73) Assignee: Infineon Technologies Austria AG, Villach (AT)

( * ) Notice: Subject to any disclaimer, the term of this patent is extended or adjusted under 35 U.S.C. 154(b) by 55 days.

(21) Appl. No.: 16/698,264

(22) Filed: Nov. 27, 2019

(65) Prior Publication Data

US 2021/0159788 A1 May 27, 2021

(51) Int. Cl.
*H02M 3/158* (2006.01)
*H02M 3/335* (2006.01)
*H02M 3/157* (2006.01)
*H02M 1/00* (2006.01)

(52) U.S. Cl.
CPC ......... *H02M 3/1588* (2013.01); *H02M 3/157* (2013.01); *H02M 3/158* (2013.01); *H02M 3/33507* (2013.01); *H02M 2001/0009* (2013.01); *H02M 2001/0038* (2013.01)

(58) Field of Classification Search
None
See application file for complete search history.

(56) References Cited

U.S. PATENT DOCUMENTS

| | | | | |
|---|---|---|---|---|
| 6,476,589 B2 * | 11/2002 | Umminger | .......... | H02M 3/1584 323/220 |
| 7,045,993 B1 * | 5/2006 | Tomiyoshi | .......... | H02M 3/1588 323/224 |
| 7,372,241 B1 * | 5/2008 | Tomiyoshi | .......... | H02M 3/1588 323/288 |
| 7,936,160 B1 * | 5/2011 | Sheehan | ............... | H02M 3/156 323/285 |
| 8,278,903 B1 * | 10/2012 | Guo | .................... | H02M 3/1588 323/288 |
| 9,035,624 B1 | 5/2015 | Rahimi et al. | | |
| 9,379,612 B2 * | 6/2016 | Ozawa | .................. | H02M 3/158 |
| 9,397,564 B2 * | 7/2016 | Sahu | ..................... | H02M 3/158 |
| 9,793,798 B1 * | 10/2017 | de Cremoux | ......... | H02M 3/156 |
| 10,044,267 B1 * | 8/2018 | Childs | .................. | H02M 3/157 |

(Continued)

*Primary Examiner* — Yusef A Ahmed
(74) *Attorney, Agent, or Firm* — Murphy, Bilak & Homiller, PLLC

(57) ABSTRACT

A current estimation circuit is configured to estimate current within a power switch, e.g., within a switching voltage converter, using a voltage measured across its load terminals and its on-state resistance. Ringing and other transient anomalies associated with a turn-on transition of the power switch are neglected by ignoring the measured voltage across the power switch for a blanking interval after the transition. During the remainder of the conduction interval of the power switch, the measured voltage is sampled to provide first and second samples. Also during this interval, a slope of the measured voltage is estimated and tracked. The estimated slope and the first and second samples are combined to produce an estimate of the current for the entire conduction interval of the power switch, including the blanked interval. The estimated slope is used to correct for inaccuracy introduced by not using measured voltage during the blanking interval.

18 Claims, 9 Drawing Sheets

(56) References Cited

U.S. PATENT DOCUMENTS

| | | | |
|---|---|---|---|
| 10,063,146 B1* | 8/2018 | Lee | G01R 19/16552 |
| 10,199,919 B2* | 2/2019 | Gammie | G05F 1/24 |
| 10,454,371 B1* | 10/2019 | Masini | H02M 3/1582 |
| 10,469,073 B1* | 11/2019 | Ozalevli | H02M 3/156 |
| 10,581,325 B1* | 3/2020 | Munroe | H02M 3/158 |
| 2007/0108951 A1* | 5/2007 | Coleman | H02M 3/156 323/282 |
| 2011/0050187 A1* | 3/2011 | Lai | H02M 3/1588 323/282 |
| 2012/0078556 A1 | 3/2012 | Holmberg et al. | |
| 2014/0140109 A1* | 5/2014 | Valley | H02M 3/33507 363/21.17 |
| 2014/0177289 A1* | 6/2014 | Chen | H02M 3/33507 363/21.13 |
| 2014/0247029 A1* | 9/2014 | Krabbenborg | H02M 3/156 323/282 |
| 2014/0375332 A1* | 12/2014 | Michal | H02M 3/158 324/537 |
| 2015/0323570 A1 | 11/2015 | Guthrie et al. | |
| 2015/0381051 A1 | 12/2015 | Li | |
| 2016/0336857 A1* | 11/2016 | Liu | H02M 3/1588 |
| 2017/0346397 A1* | 11/2017 | Babazadeh | H02M 3/157 |
| 2018/0152111 A1* | 5/2018 | Tschirhart | H02M 1/088 |
| 2020/0358354 A1* | 11/2020 | You | H02M 3/156 |

* cited by examiner

SLOPE DETECTION AND CORRECTION FOR CURRENT SENSING USING ON-STATE RESISTANCE OF A POWER SWITCH

TECHNICAL FIELD

The present application relates to techniques for estimating current in an inductor of a switching voltage converter using the on-state resistance of a power switch connected to the inductor, wherein the current is estimated using a slope that is determined subsequent to a blanking interval after the switch is transitioned to its on state, together with samples that are taken subsequent to the blanking interval.

BACKGROUND

Accurate current sensing is needed when powering many electronic loads, such as central processing units (CPUs), graphics processing units (GPUs), digital signal processors (DSPs), and application-specific integrated circuits (ASICs), particularly when such loads are used in server and telecommunications applications. Accurate current sensing enables optimization of the performance of such processors, and allows for precise thermal management of processor systems. For large server farms, this leads to potentially significant cost savings in that the power used to cool servers may be maintained at minimal levels. Furthermore, the infrastructure required for the cooling may be constrained to a minimal level, i.e., not significantly oversized, such that the cost of the cooling infrastructure may be reduced when accurate current sensing is available.

Processors and other circuitry used within servers, and in other applications, are typically powered using switching voltage converters. In a server application, a high direct-current (DC) voltage, e.g., 48V, is often widely distributed, and is down-converted by point-of-load (POL) switching voltage converters located physically close to each processor or other load. In many applications, POL converters may reduce the widely distributed high DC voltage to lower voltages such as 12V, 3.3V, 1.8V, etc. A frequently used type of POL converter is the buck converter, which, in its most common form, uses high and low-side power switches to control power flow into an energy-storage inductor that is coupled to a load.

Estimation of the power consumption of the load may be accomplished by sensing current in the energy-storage inductor of, e.g., a buck converter. While there are numerous techniques for such current sensing, one of the most popular is to sense the voltage across one (or both) of the power switches connected to the inductor, and to use the on-state resistance (e.g., $R_{DSON}$) of the power switch (or switches) to estimate the current through that switch (or those switches). The current in a given power switch, which corresponds to the current in the inductor, may then be estimated using the voltage measured across load terminals of the switch and the characteristic on-state resistance (e.g., $R_{DSON}$) of the switch. $R_{DSON}$-based current sensing does not waste power in the switching converter, as do other current-sensing techniques, such as those based on shunt resistors. Additionally, $R_{DSON}$-based current sensing is more accurate than many techniques, e.g., techniques based on Hall-effect sensors or inductor DCR sensing, and does not require expensive or large circuit components.

The current flowing through the high-side switch and the inductor of a buck converter increases linearly when the high-side switch is conducting, and the current through the low-side switch and the inductor decreases linearly when the low-side switch is conducting. While the voltage across a conducting power switch, e.g., the drain-to-source voltage $V_{DS}$, ideally follows the linear increase and decrease of the inductor current, in practice the waveform for the power switch voltage $V_{DS}$ includes anomalies during the time intervals immediately after a power switch transitions between its off and on states. In particular for the turn-on transition of a low-side switch in a buck converter, this voltage waveform exhibits ringing due to ground bounce as well as other undesirable artifacts (noise) just after such a transition. This means that $R_{DSON}$-based current sensing based on the power switch voltage $V_{DS}$ will not provide very accurate current estimates, at least not without some sort of mitigation to handle such noise.

One technique for mitigating noise in the power switch voltage $V_{DS}$ immediately after a turn-on transition is to filter out the ringing/noisy portion of the voltage waveform, i.e., to treat the voltage waveform as unusable for a blanking time interval just after a turn-on transition and to estimate the current using the remainder of the voltage waveform after the blanking interval. Such blanking avoids inaccuracies caused by artifacts at the turn-on transition, but ignoring the portion of the voltage waveform during the blanking interval will skew the current estimate, thereby generating another type of inaccuracy. This inaccuracy may be tolerable in some scenarios, e.g., when the blanking interval is a small portion of the turn-on interval of the power switch, as occurs with low switching frequencies. In general, however, the switching frequencies used by switching voltage converters, including buck converters, are on a long-term upward trajectory. Higher switching speeds allow the use of smaller energy-storage inductors which, in turn, provides higher power density for switching voltage converters. As switching frequencies increase, inaccuracies associated with such blanking intervals become significant enough that they may no longer be negligible.

SUMMARY

Circuits and techniques are needed for estimating the current of an inductor in a switching voltage converter by using the on-state resistance of a power switch, and which compensate for estimation inaccuracy caused by blanking of sensed signals immediately after a turn-on transition of the power switch.

According to an embodiment of a current estimation circuit, the current estimation circuit is configured to estimate current in a power switch during a conduction interval of the power switch. The power switch is typically part of a switching power converter, and the estimated current corresponds to, and may be equivalent to, an output current of the switching power converter. The current estimation circuit includes a slope estimator and a sampler circuit. The slope estimator is configured to estimate a slope representative of the current in the power switch during a portion of the conduction interval that begins at or after a first delay from a turn-on transition of the power switch. The sampler circuit is configured to generate a first sample, which corresponds to a first sensed voltage across the power switch at or after the first delay from the turn-on transition, and to generate a second sample, which corresponds to a second sensed voltage across the power switch, which is after the first sensed voltage. The first delay includes a blanking interval, so as to avoid taking samples or estimating slope during a portion of the sensed voltage immediately after a turn-on transition of the power switch, during which time ringing or other artifacts make the sensed voltage unusable.

The current estimation circuit is configured to estimate current in the power switch over the conduction interval based on the first sample, the second sample, and the estimated slope.

According to an embodiment of a power conversion system, the power conversion system includes a switching voltage converter and a current estimation circuit. The switching voltage converter includes a power switch and an inductor. The current estimation circuit of the power conversion system is configured and includes components as described above.

According to an embodiment of a method, the method is for estimating current in a power switch having a switch voltage between first and second load terminals of the power switch. The method comprises turning on the power switch at a turn-on transition, and turning off the power switch at a turn-off transition. The method further comprises estimating a slope that is representative of the current in the power switch between a first time instant, which is a first delay after the turn-on transition, and a second time instant, which is after the first time instant and at or before the turn-off transition. The method includes sampling the switch voltage at a first sample time that is at or after the first delay after the turn-on transition, resulting in a first sampled voltage, and sampling the switch voltage at a second sample time that is after the first sample time and at or before the turn-off transition, resulting in a second sampled voltage. The method additionally includes outputting an estimated current based on the first sampled voltage, the second sampled voltage, and the estimated slope.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description that follows.

DETAILED DESCRIPTION

Figure 1:
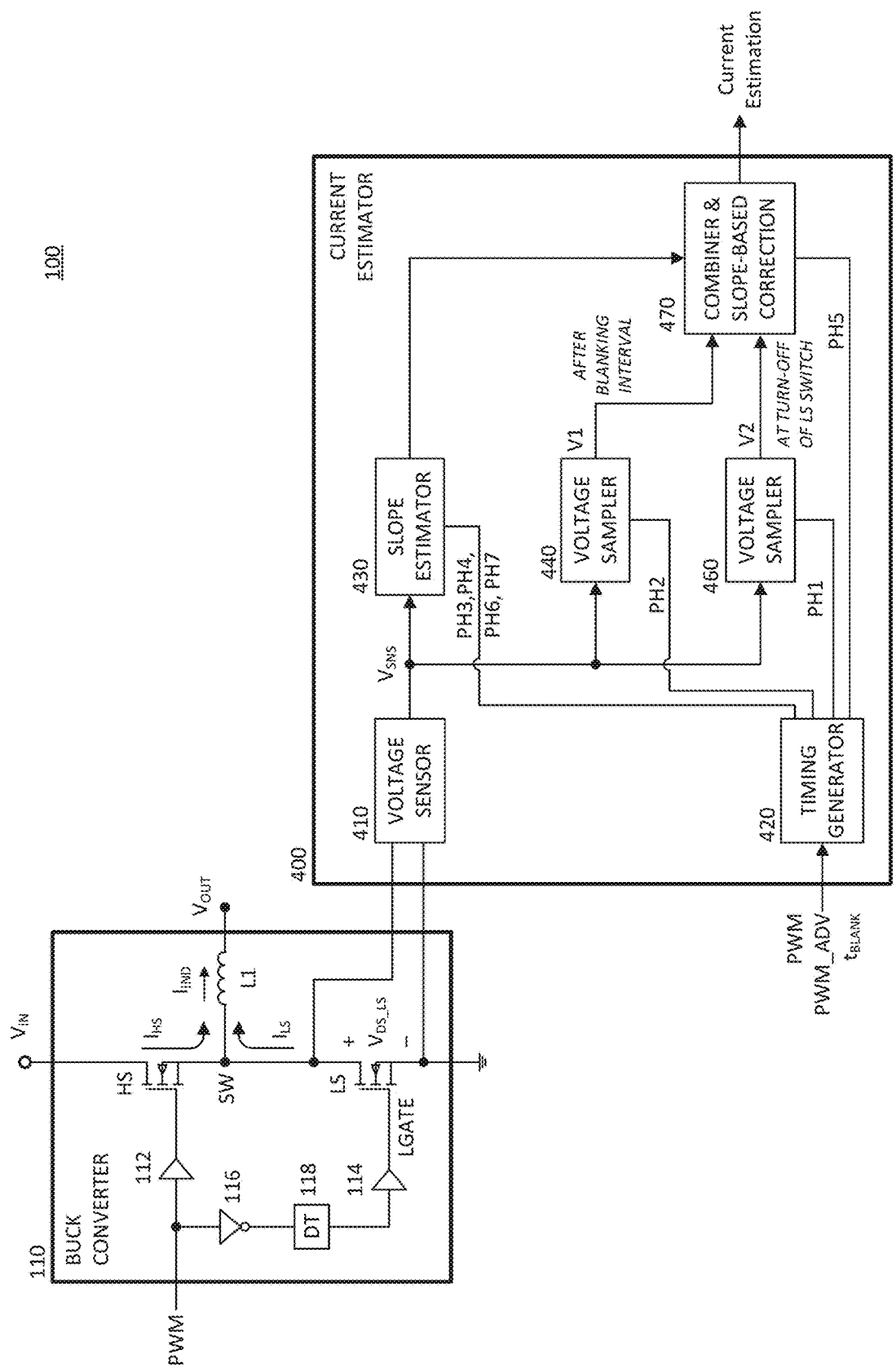
FIG. 1 illustrates a schematic diagram of a switching voltage converter system that includes current estimation circuitry that uses the on-state resistance of a power switch.

The embodiments described herein provide circuits and methods for estimating current within an inductor of a switching voltage converter. The techniques of the described embodiments sense a voltage across the load terminals of a power switch within the switching voltage converter, wherein the power switch provides current to the inductor. Because this power switch voltage exhibits ringing or other anomalies just after a transition of the power switch, the current estimation blanks (ignores) the sensed voltage for a blanking interval after the transition. Unlike prior current estimation techniques, the techniques herein correct for the portion of the waveform that is blanked. This correction is performed by circuitry that estimates a slope of the waveform after the blanking interval, and uses this slope to model a version of the waveform during the blanking interval. The slope and/or the modelled waveform are used to correct errors in the current estimation that are caused by the waveform blanking.

Existing power conversion systems often use low enough switching frequencies that the inaccuracy caused by waveform blanking is not significant. However, use of low switching frequencies requires larger energy-storage inductors within a switching power converter. It is desired that accuracy of the current estimation not be a limiting factor for increasing switching frequency, which has a general advantage of decreasing cost and size of switching power converters. Hence, existing current estimation techniques that merely ignore the sensed voltage during the blanking interval provide an undesirable long-term solution, since they effectively place limits on the switching frequency.

Other existing power conversion systems are merely overdesigned such that underestimation of the inductor current incurs no significant problem, e.g., overheating. Such overdesigning has the undesirable effect of using cooling at an unnecessary level, and/or of providing unnecessarily large cooling infrastructure, e.g., heatsinks, fans, air conditioning.

Switching voltage converters typically include a controller for generating switch control signals and which may, to varying extents, be involved with the current estimation. One option for addressing inaccuracy caused by the blanking is to have the controller add a crude compensation term to an estimated current, so as to reduce the inaccuracy. The crude compensation may be a constant, and may be based on the blanking interval. More complex compensation, e.g., based on the duty cycle or using sampling taken more frequently than the switching frequency, is generally not feasible, or at least not desirable, as such complexity will often limit the possible switching frequency. Instead, it is desired that current estimation be performed by dedicated circuitry that provides an accurate current estimate to the controller, such that the controller does not need to perform complex calculations within a switching cycle. While the claimed inventions are not limited thusly, the examples described herein use current estimation circuitry that provides an accurate current estimate sample for each switching cycle of the voltage converter, such that minimal involvement of the controller is required for the current estimation. While the current estimation circuitry ignores the sensed voltage waveform during a blanking interval, the blanking is compensated by the current estimation circuitry. This compensation works over a wide range of duty cycles, and does not place any significant limit on the switching frequency, as other components, e.g., the power switches or the controller, will typically set the upper limit for the switching frequency.

For clarity of description, the embodiments are described below in the context of particular examples that are based upon a non-isolated switching voltage conversion system that uses a buck converter. However, the techniques may be extrapolated for use with other non-isolated switching voltage converters, e.g., a boost converter or buck-boost converter, and even isolated voltage converters wherein the current through a power switch is estimated. The techniques are described using examples in which the current estimation is based upon voltage that is sensed across load terminals of a power switch. However, other current estimation techniques, e.g., techniques measuring voltage across a shunt resistor in series with the power switch, that require the use of blanking to filter out noisy portions of a sensed waveform may also benefit from the described current estimation circuits and techniques.

The described embodiments provide particular examples for purposes of explanation, and are not meant to be limiting. Features and aspects from the example embodiments may be combined or re-arranged, except where the context does not allow this. The following begins with a description of a voltage conversion system including a buck converter and a current estimator. Next, detailed circuitry for implementing the current estimator is described. Finally, exemplary methods for estimating current in a power switch of a switching voltage converter are described.

FIG. 1 illustrates a schematic diagram for a voltage conversion system 100, which includes a buck converter 110 and current estimation circuitry 400. The buck converter 110 includes a high-side power switch HS and a low-side power switch LS, which are connected at a switching node SW. An inductor L1 couples the switching node SW to an output having voltage $V_{OUT}$. The output is for connecting to a load (not shown for ease of illustration), such as a CPU, which is powered by the voltage $V_{OUT}$. The high-side switch HS is further coupled to an input, which supplies a voltage $V_{IN}$, and the low-side switch LS is coupled to ground. The buck converter 110 steps down the supply voltage $V_{IN}$ to provide the output voltage $V_{OUT}$. For example, the buck converter may step down an input voltage $V_{IN}$=12V to produce an output voltage $V_{OUT}$=3.3V.

The high and low-side power switches HS, LS illustrated in FIG. 1 are n-channel metal-oxide semiconductor field-effect transistors (MOSFETs), but other switch types may be used. For example, p-channel MOSFETs, junction field-effect transistors (JFETs), insulated gate bipolar transistors (IGBTs), high electron mobility transistors (HEMTs), or other types of power transistors may be preferred in some applications. The high-side switch HS has a gate that is controlled by a pulse-width-modulated (PWM) control signal, via a high-side gate driver 112. The low-side power switch LS has a gate that is controlled by an inverted version LGATE of the PWM signal, via a low-side driver 114 and dead-time insertion circuitry 118. An inverter 116, in conjunction with the dead-time insertion circuit 118, causes the high and low-side power switches HS, LS to conduct alternately, except for a small dead-time that is inserted between conduction intervals so as to avoid current shoot-through from the supply, with voltage $V_{IN}$, to ground.

When the high-side switch HS conducts, a current $I_{HS}$ flows through it and is directly passed to the inductor L1, such that the high-side and inductor currents $I_{HS}$, $I_{IND}$ are the same. (During such high-side conduction intervals, no appreciable current flows through the low-side switch LS.) When the low-side switch LS conducts, a current $I_{LS}$ flows through it and is directly passed to the inductor L1, such that the low-side and inductor currents $I_{LS}$, $I_{IND}$ are equivalent. (During such low-side conduction intervals, no appreciable current flows through the high-side switch HS.) At least during typical operation of the buck converter 110, these currents $I_{HS}$, $I_{LS}$ are positive in the directions illustrated in FIG. 1.

The level of the output current $I_{IND}$ provided by the buck converter 110 is determined by the PWM control signal, which is typically generated by a controller (not shown for ease of illustration) of the buck converter 110. Such a controller and its constituent parts may be implemented using a combination of analog hardware components (such as transistors, amplifiers, diodes, and resistors) and processor circuitry that includes primarily digital components. The controller may include one or more of a digital signal processor (DSP), a general-purpose processor, and an application-specific integrated circuit (ASIC). A memory coupled to the controller may include non-volatile memory such as flash, in which instructions and/or data may be stored for use by the controller. To provide a regulated output voltage $V_{OUT}$, the controller senses the output voltage $V_{OUT}$ and adjusts a duty cycle and/or a frequency of the PWM signal, so as to produce an appropriate inductor current $I_{IND}$ that maintains the output voltage near a target voltage $V_{TGT}$, e.g., the 3.3V level mentioned previously. The PWM signal is typically generated using a closed-loop control technique, such as in a proportional-integral-derivative (PID) controller. Because voltage converter controllers and closed-loop control techniques are well-known in the art, such controllers and techniques are not described further, so as to not obscure the unique aspects of the invention.

The current estimation circuitry 400 is coupled to the buck converter 110. As illustrated, this circuitry 400 senses a voltage $V_{DS\_LS}$ across load terminals, e.g., drain and source terminals, of the low-side power switch LS. The current estimator 400 outputs an estimate of the inductor current $I_{IND}$, or a similar parameter that may be readily converted to a current estimate. The current estimator 400 includes a voltage sensor 410, a timing generator 420, a slope estimator 430, voltage sampler circuits 440, 460, and a combiner and slope-based correction circuit 470. These circuits are described immediately below at a high level, and are described in further detail in conjunction with the waveforms of FIGS. 2-3 and the circuits of FIGS. 4A-4B.

The voltage sensor 410 is coupled to the load terminals of the low-side switch LS so as to sense the voltage $V_{DS\_LS}$ across these terminals. While one of these terminals, e.g., the source terminal, is tied to ground, the voltage sensor 410 preferably senses this voltage differentially, so as to provide good common-mode rejection, including accounting for any local ground node noise associated with transitioning of the low-side power switch LS. The voltage sensor 410 outputs a sensed voltage $V_{SNS}$, corresponding to the voltage $V_{DS\_LS}$. As explained below in relation to FIG. 4A, the sensed voltage $V_{SNS}$ may be amplified, inverted, and/or level shifted relative to the voltage $V_{DS}$ LS, so as to provide a positive voltage and/or so as to have a voltage level that is high enough to avoid potential undesirable effects from noise.

The sensed voltage $V_{SNS}$ is provided to the slope estimator 430 and the voltage samplers 440, 460. These circuits 430, 440, 460 ignore the sensed voltage $V_{SNS}$ during a blanking interval immediately after the low-side switch LS is transitioned on, as well as during a conduction (on) interval of the high-side power switch HS. The slope estimator 430 estimates the slope of the sensed voltage $V_{SNS}$, which corresponds directly to the low-side current $I_{LS}$, during an interval after the blanking interval and before the low-side switch is turned off. The blanking interval is set so as to avoid noise/ringing associated with the turn-on transition of the low-side switch LS, and to allow for settling of the sensed voltage $V_{SNS}$. As explained in the description of FIGS. 4A and 4B, the slope estimator may use closed-loop feedback to generate and update the slope estimate during the non-blanked portion of the low-side conduction interval, and may maintain this slope estimate after the low-side conduction interval, e.g., during high-side conduction intervals. By maintaining the slope estimate thusly, a valid slope estimate may be provided to the combiner and slope-based correction circuit 470 even after the low-side switch LS has been turned off. The slope estimation provided by the slope estimator 430 does not need to be dependent on a switching frequency of the voltage converter 110, the output voltage $V_{OUT}$, or the inductance of the inductor L1.

The first voltage sampler 440 samples the sensed voltage $V_{SNS}$, preferably at a time t2 that is immediately after the blanking interval, so as to produce a voltage sample V1. The second voltage sampler 460 samples the sensed voltage $V_{SNS}$, preferably at a time t3 at or near the turn-off transition of the low-side switch LS, so as to produce a voltage sample V2. While the examples below describe that the sample V2 is taken at a time instant corresponding to the turn-off transition of the low-side switch LS, other implementations may take the sample V2 sooner than the turn-off of the low-side switch LS, but after the sample time for V1, and may compensate for such timing differences. For ease of description and because such timing variations provide similar results, such timing variations are not described further.

The timing generator 420 produces timing pulses to control sampling and other timing in the slope estimator 430 and the sampling circuits 440, 460. The timing signals PH1, PH2, PH3, PH4, PH6, and PH7 are generated so as to ensure the slope estimation is based upon the sensed voltage $V_{SNS}$ within a time window after the blanking interval and before the turn-off transition of the low-side switch LS, and that the voltage samples V1, V2 are taken within this same window such that the voltage sample V2 is taken after the voltage sample V1. The timing generator 420 additionally generates a timing signal PH5 that is used to appropriately latch signals that provide the final output from the combiner and slope-based correction circuit 470.

The timing generator 420 inputs the PWM signal that is used to control the high and low-side switches, as well as an early version of this signal, denoted PWM_ADV. The timing generator 420 also inputs a time delay $t_{BLANK}$ corresponding to the blanking interval, or maintains this delay within a memory of the timing generator 420. The timing generator 420 is illustrated as a circuit within the current estimator 400, but may instead by included in the controller that generates the PWM signal.

The combiner and slope-based correction circuit 470 generates the current estimation, or a signal corresponding to such estimation, based upon the estimated slope and the voltage samples V1, V2. In one technique, the first voltage sample V1 is adjusted based on the estimated slope, such that the adjusted voltage is an extrapolated voltage corresponding to an expected voltage V0 when the low-side switch is first transitioned on, if the switch transition artifacts (ringing and noise) during the blanking interval had not corrupted this voltage. The adjusted voltage and the second voltage sample V2 are averaged, in one embodiment, so as to provide a sensed voltage estimate that accurately represents the average current $<I_{IND}>$ of the low-side switch over its entire conduction interval, and which accurately represents the inductor current $I_{IND}$ over the present switching cycle of the buck converter 110. In a second technique, the voltage samples V1, V2 are combined, e.g., via averaging, to produce a preliminary voltage corresponding to a current estimate. A correction factor (voltage) based on the slope estimate is then applied to the preliminary voltage, so as to produce a corrected average voltage, which corresponds to the estimated current $<I_{IND\_EST}>$. Both techniques determine a slope estimate and use this slope estimate to correct for inaccuracy caused by ignoring the sensed voltage $V_{SNS}$ during the blanking interval. While the described examples focus on techniques in which an average current is estimated, the estimated slope may also be used to estimate current at specific instances in time, e.g., such that current may be periodically estimated and reported at a frequency that is higher than the switching frequency of a voltage converter.

Figure 2:
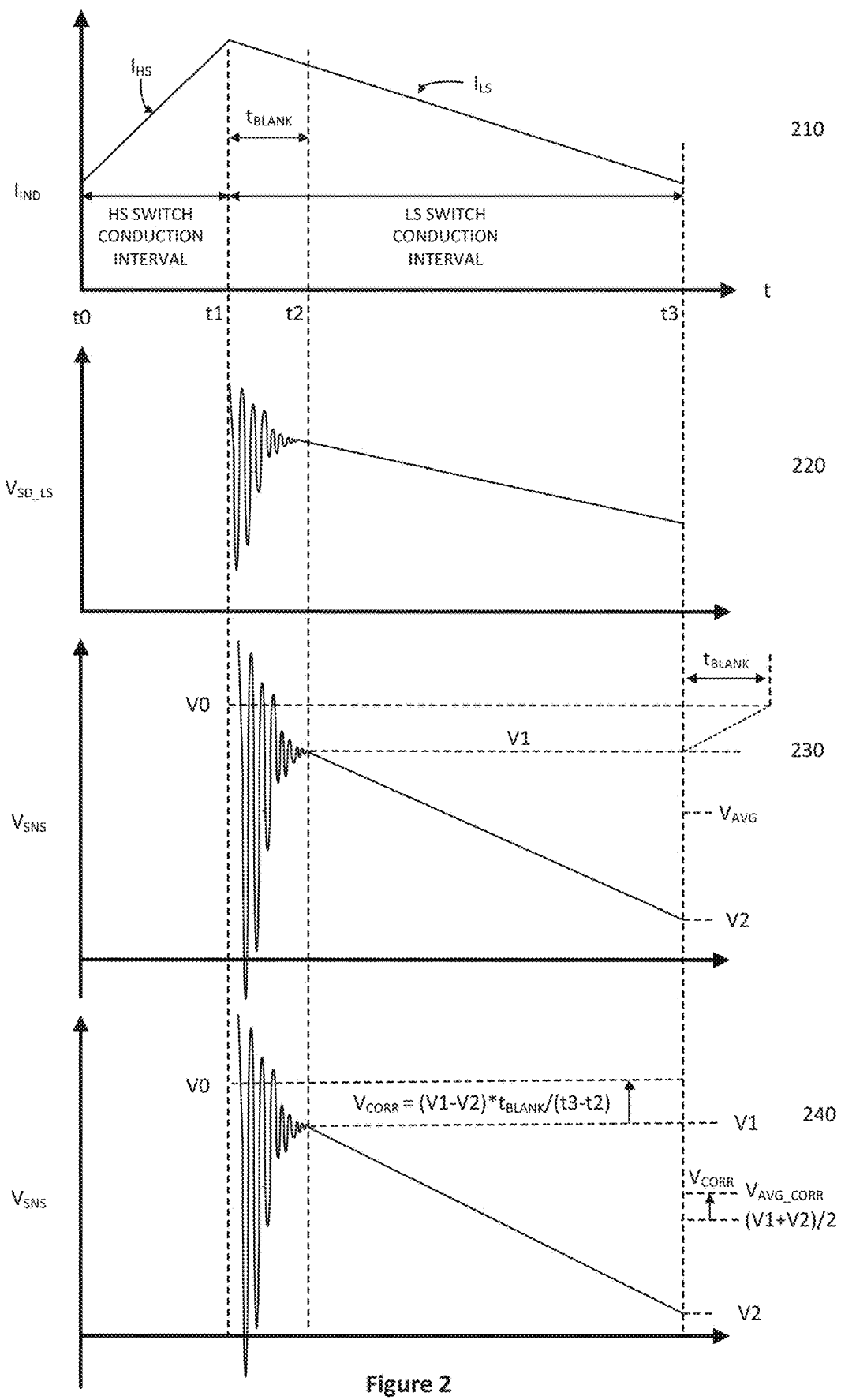
FIG. 2 illustrates waveforms corresponding to voltages and currents within the switching voltage converter of FIG. 1.

FIG. 2 illustrates waveforms corresponding to voltages and currents within the voltage conversion system 100 of FIG. 1. A first waveform 210 shows the inductor current $I_{IND}$ over one switching cycle of the buck converter 110. Between times t0 and t1, the high-side power switch HS conducts, leading to the illustrated high-side current $I_{HS}$, which linearly increases during this interval. Between times t1 and t3, the low-side power switch LS conducts, leading to the illustrated low-side current $I_L$, which linearly decreases during this interval. The inductor (output) current $I_{IND}$ consists of a combination of the high and low-side currents $I_{HS}$, $I_{LS}$, such that the inductor current $I_{IND}$ linearly increases from time t0 to t1, and linearly decreases from time t1 to t3. The general linear increase/decrease pattern of the inductor current $I_{IND}$ repeats for each switching cycle. However, for a fixed-frequency PWM signal, the PWM duty cycle and the corresponding time t1 will change as more or less current is required by the load connected to the buck converter 110.

The illustrated waveforms of FIG. 2 correspond to operation of the buck converter 100 in a continuous conduction mode (CCM), and in which the inductor current IND is always positive in the illustrated current direction shown in FIG. 1. However, the current estimation techniques described herein also apply to operation in discontinuous conduction mode (DCM), as well as operation in which current flows through the inductor L1 in a direction opposite to that illustrated.

The high and low-side switches HS, LS have on-state resistances $R_{DS\_ON}$, which characterize the relationship between the voltage across and the current through these switches HS, LS when these switches are in their fully on (saturated) states. Referring to FIG. 1, $V_{DS\_HS}=R_{DS\_ON\_HS}*I_{HS}$ and $V_{SD\_LS}=R_{DS\_ON\_LS}*I_{LS}$. Using these relationships, the currents $I_{HS}$, $I_{LS}$, $I_{IND}$ may be estimated using voltages measured across the switches HS, LS.

The second waveform 220 of FIG. 2 shows a voltage $V_{SD\_LS}$ from the source to the drain terminal of the low-side switch LS, i.e., the voltage drop from ground to the switching node SW. Prior to time t1, the switching node SW is coupled to the source voltage $V_{IN}$, such that the voltage at the switch node SW is equal to the source voltage $V_{IN}$ minus a small voltage drop $V_{DS\_HS}$ across the high-side switch. After time t1, the switching node SW is coupled to ground via the low-side switch LS. However, the voltage at the switching node SW actually becomes slightly negative, due to the voltage drop across the low-side switch LS. The second waveform 220 shows a positive source-to-drain voltage $V_{SD\_LS}$ for the time interval from t1 to t3. After time t2, the voltage $V_{SD\_LS}$ is linear and follows (is linearly related to) the current $I_{LS}$, i.e., $V_{SD\_LS}=R_{DS\_ON\_LS}*I_{LS}$.

However, the turn-on transition of the low-side switch LS at time t1 generates significant artifacts, primarily in the form of high-frequency ringing induced by the attempted sharp voltage transition. These artifacts make the switch voltage $V_{SD\_LS}$ (or $V_{DS\_LS}$) unusable for current estimation during the interval immediately after the turn-on transition at time t1. This unusable interval is denoted $t_{BLANK}$ in FIG. 2, and encompasses a delay corresponding to the ringing/noise of the switch voltage as well as a small delay that allows the output $V_{SNS}$ of voltage sensor 410 to settle to a valid and stable voltage. As described previously and explained in further detail below, the voltage ($V_{SD\_LS}$ or $V_{DS\_LS}$) across the low-side switch LS may be used between times t2 and t3 for estimating a slope of the current ($I_{LS}$ or $I_{IND}$) and for estimating an absolute current at particular sample points in time.

The voltage sensor 410 senses the differential voltage between the switching node SW and ground, i.e., $V_{DS\_LS}$s, which is the negative of the voltage $V_{SD\_LS}$ shown in the second waveform 220. The voltage sensor 410 inverts and level shifts the voltage $V_{DS\_LS}$, such that this voltage is positive during the time interval of interest, i.e., after the blanking interval. Additionally, the magnitude of the voltage $V_{DS\_LS}$ is typically relatively small. (For example, the on-state resistance for low-voltage power MOSFETs can be as low as 1 to 5 ml. For an output current of 100 A, the resultant voltage is only 100 to 500 mV.) So as to limit the effect of noise within the current estimator 400, the voltage sensor 410 amplifies the voltage before distributing it to the slope estimator 430 and the voltage samplers 440, 460. The resultant voltage $V_{SNS}$ output from the voltage sensor 410 is shown in the third and fourth waveforms 230, 240. The voltage $V_{SNS}$ is inverted, level-shifted, and amplified relative to the source-to-drain voltage $V_{SD\_LS}$. The third waveform 230 illustrates a technique, such as that of the circuit in FIG. 4A, whereby the voltage sample V1 is increased for a period of $t_{BLANK}$, and an average voltage $V_{AVG}$ is then determined from the updated voltage V1 and voltage sample V2. The fourth waveform 240 illustrates a technique, such as that of the circuit in FIG. 4B, whereby the voltage samples V1 and V2 are averaged, and then a correction is applied to arrive at a final voltage $V_{AVG\_CORR}$ used in estimating the current.

Figure 3:
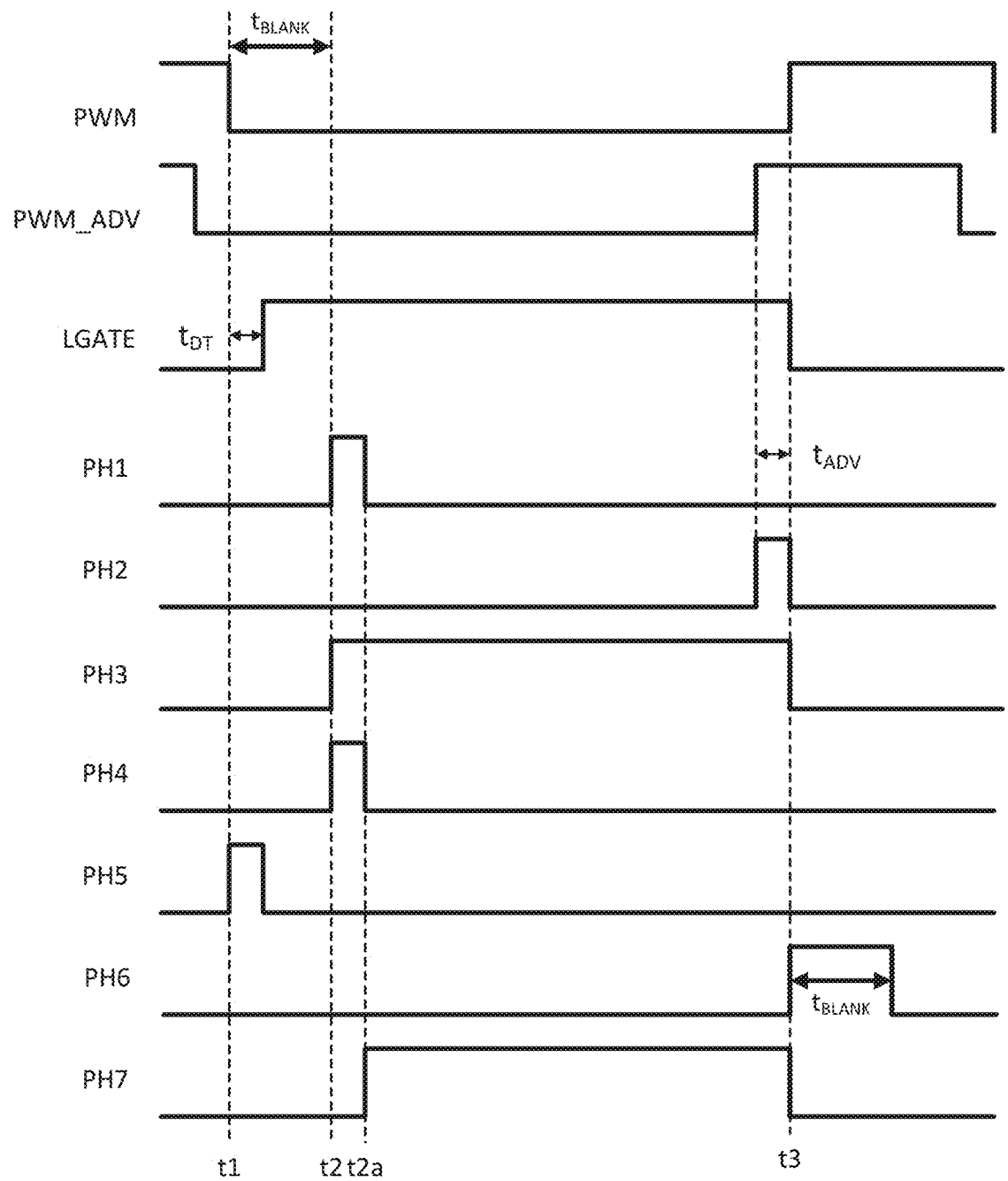
FIG. 3 illustrates waveforms for timing signals in the switching voltage converter system of FIG. 1.

FIG. 3 illustrates timing signals PH1-PH7 generated by the timing generator 410, or similar, and used by the slope estimator 430, the voltage samplers 440, 460, and the combiner and slope-based correction circuit 470. These signals are described immediately below, and their use is explained further in the descriptions of the circuits 400A, 400B of FIGS. 4A and 4B.

The baseline for generating the output timing signals is the PWM signal that is used to control the high and low-side power switches HS, LS, and which is typically generated by a PWM generator within a buck converter controller. Additionally generated is an early version PWM_ADV of the PWM signal, which precedes the PWM signal by a time interval $t_{ADV}$. A low-side control signal LGATE is generated from an inverted version of the PWM signal. The rising edge of this signal LGATE is delayed by a dead-time tor, so as to provide a safety margin that prevents the high and low-side switches HS, LS from simultaneously conducting. Otherwise, propagation delays, e.g., through the low-side driver 114, are considered negligible and are not shown.

Time pulses PH1 and PH4 are generated at a time t2, which is the blanking interval $t_{BLANK}$ after the falling edge of the PWM signal. These pulses only need to be long enough to trigger sample and hold circuits. Also at time t2, the timing signal PH3 rises. This signal stays active until the end of the conduction interval for the low-side switch LS, e.g., time t3 which is coincident with a rising edge of the PWM signal. The timing signal PH3 indicates the time interval during which the sensed voltage $V_{SNS}$ is useable. The timing signal PH6 is high for an interval of time corresponding to the blanking interval $t_{BLANK}$ and, as shown, rises at the falling edge of the PWM signal.

A time pulse PH2 is generated just before the end of the usable conduction interval, so as to latch a final voltage. This is accomplished using the early PWM signal PWM_ADV, such that the pulse PH2 is activated a time interval $t_{ADV}$ before the end of the low-side conduction interval. As with pulses PH1, PH4, the pulse PH2 has a duration long enough to allow a sample and hold circuit to properly latch a voltage. A time pulse PH5 is generated starting at time t1.

Figure 4A:
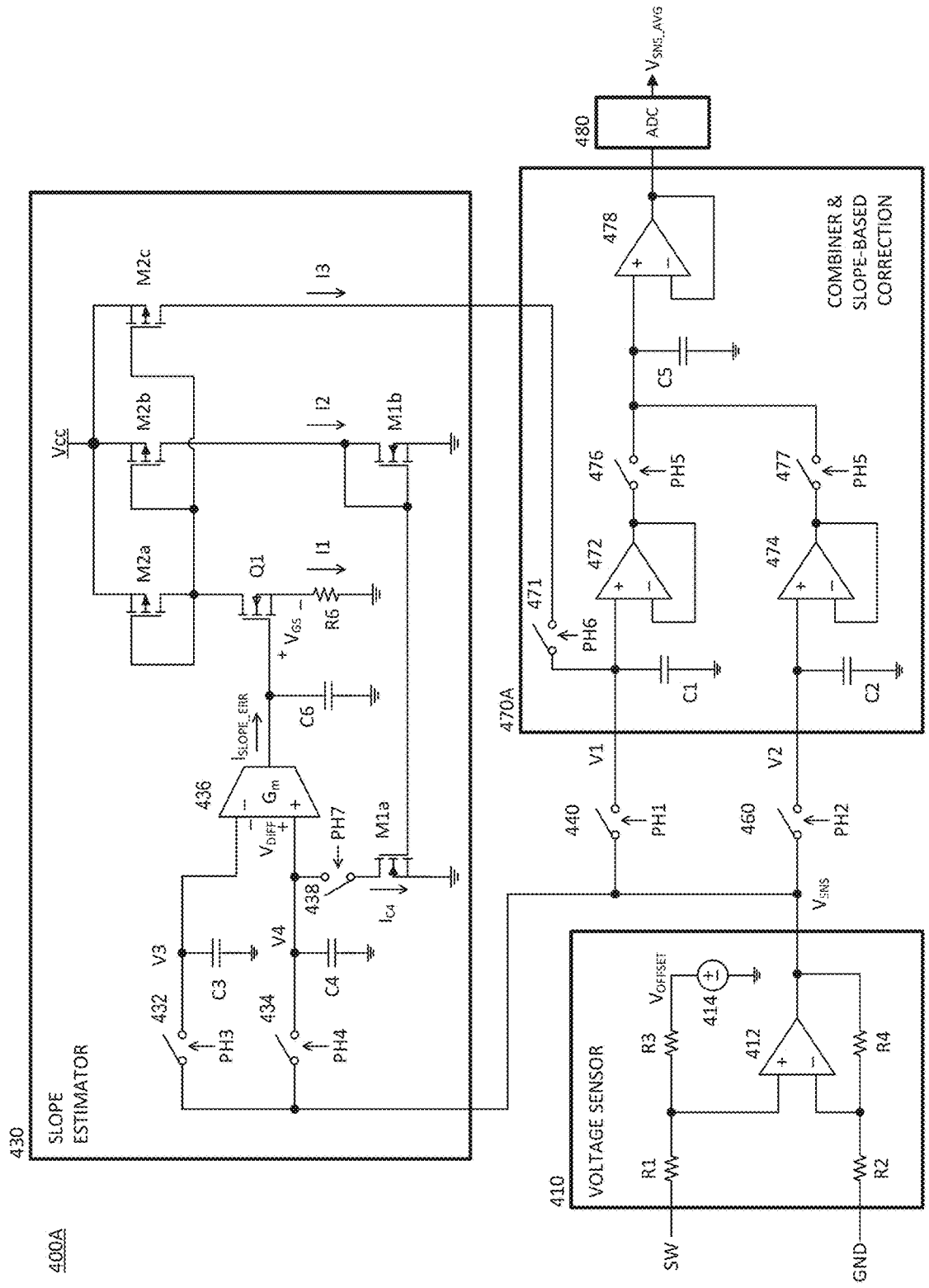
FIGS. 4A and 4B illustrate schematic diagrams of more detailed circuitry for current estimation using the on-state resistance of a power switch.
Figure 4B:
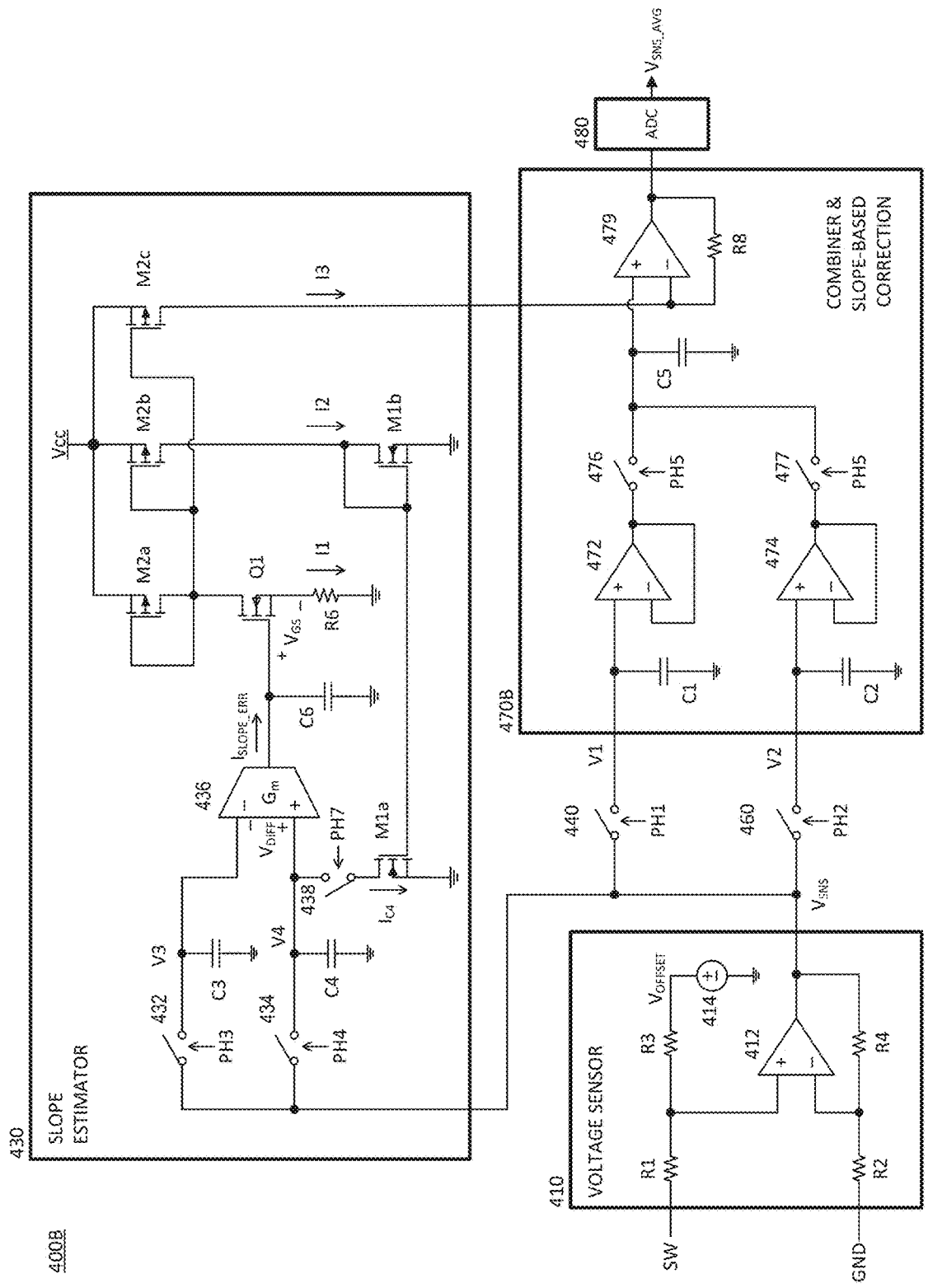

FIGS. 4A and 4B illustrate detailed circuitry 400A, 400B corresponding to the current estimator 400 of FIG. 1. Each of these circuits includes a voltage sensor 410, a slope estimator 430, voltage sampler circuits 440, 460, and a combiner and slope-based correction 470. The circuitry 400A of FIG. 4A is described in detail below. This is followed by a description of those parts of the circuitry 400B of FIG. 4B that differ from that of FIG. 4A.

The voltage sensor 410 is configured to level shift and inversely amplify the voltage between the switching node SW and ground. The voltage sensor includes a voltage source 414, which level shifts the input voltage by $V_{OFFSET}$, e.g., by 300 mV. The amplifier 412 is configured to inversely amplify the input differential voltage, as determined by R1, R2, R3, R4. In a particular example, R1=R2=15 kΩ, and R3=R4=120 kΩ, such that the resultant sense voltage $V_{SNS}$ output by the voltage sensor 410 is level shifted by 300 mV and amplified by 8. Of course, other amplification levels and voltage offsets may be used, with the specific values chosen according to the voltages produced by the switching converter and the input ranges needed by the slope estimation 430 and combiner circuits 470.

The slope estimator 430 includes switches 432, 434, transconductance amplifier 436, current-setting switch Q1, capacitor C6 and resistor R6. These components combine to generate a current I1 corresponding to the slope of the sensed voltage $V_{SNS}$ (which maps to the slope of the inductor current $I_{IND}$). This current I1 is mirrored using switches M2a, M2b, and M2c, for use by other circuits. A further current mirror comprised of M1a and M1b mirrors this current for purposes of providing a feedback path for the slope estimation.

As shown in FIG. 3, the timing signal PH4 pulses just after the blanking interval $t_{BLANK}$, and causes the sample and hold switch 434 to toggle, thereby latching the voltage $V_{SNS}$ just after time t2. This voltage, denoted V4, is initialized on the hold capacitor C4. Also at time t2, the timing signal PH3 closes the switch 432, thereby feeding the voltage $V_{SNS}$ onto the hold capacitor C3. The switch 432 is held closed until time t3, such that the voltage on capacitor C3, denoted as V3, is the same as the voltage $V_{SNS}$ between times t2 and t3, i.e., during the non-blanked conduction interval of the low-side switch LS. Note that the voltages on capacitors C3 and C4 is the same just after the blanking interval $t_{BLANK}$, i.e., V3=V4 at time t2.

The voltage V3 begins decreasing just after time t2, leading to a positive difference between the voltages V4, V3. These voltages are input to the transconductance amplifier 436, which converts the difference $V_{DIFF}(t)=V4(t)-V3(t)$ between these voltages into an error current $I_{ERR}(t)=G_m*V_{DIFF}(t)$. The error current $I_{ERR}$ charges the gate capacitance of the current-setting switch Q1. The switch Q1 has a gate capacitance $C_{GS}$, which is typically not large enough to adequately filter and maintain the gate voltage $V_{GS}$. As illustrated, the gate capacitance $C_{GS}$ is supplemented with an additional capacitor C6, e.g., adding capacitance on the order of 20 pF to the gate capacitance $C_{GS}$. The capacitance of C6 primarily determines the slew rate of the transconductance amplifier 436 and, therefore, the loop bandwidth of the correction. The additional capacitor C6 may be monolithically integrated with the switch Q1, such that the switch Q1 and capacitor C6 are in the same semiconductor die. This capacitor may be omitted in some embodiments, e.g., if the gate capacitance is high enough.

Once the gate capacitance and capacitor C6 are charged sufficiently, e.g., such that the gate voltage $V_G$s rises above a threshold voltage for the switch Q1, the current-setting switch Q1 begins to conduct. The resultant current I1 corresponds to the slope of the sensed voltage $V_{SNS}(t)$, and is scaled by the resistor R6. As explained in detail further below, this correspondence is achieved via a feedback loop wherein a current I04 drains charge from the capacitor C4, thereby diminishing the voltage V4 such that the voltage V4 tracks the voltage V3. Once steady-state operation is achieved, the current I04 should maintain a stable/constant level that corresponds to the slope at which the voltage V3 (which corresponds to $V_{SNS}(t)$ between t2 and t3) is linearly decreasing.

The current I1 flows through a transistor M2a, and transistors M2b and M2c mirror this current. The current I2, which flows through the mirror transistor M2b, is further mirrored using transistors M1a, M1b, providing a feedback path for the transconductance amplifier 436. Hence, the current $I_{C4}$ mirrors the current I2 (and I1), and drains charge from the capacitor C4 such that the voltage V4 tracks the voltage V3 ($V_{SNS}(t)$ between t2 and t3). A feedback cutoff switch 438 is controlled by the control signal PH7, such that the feedback loop is only enabled during intervals in which the sensed voltage $V_{SNS}$ is usable, e.g., during the time interval between times t2a and t3 in FIG. 3. During other intervals, including a conduction interval of the high-side switch HS and the blanking interval, the switch 438 is open such that the feedback loop is disabled and the slope estimate provided by the voltage across C6 is not updated.

Once the feedback loop reaches steady-state, the voltage V4 is decreasing at the same rate as the voltage V3, and the input voltages to the transconductance amplifier 436 are the same. This results in no current being output from the transconductance amplifier 436, i.e., $I_{SLOPE\_ERR}=0$, and the voltage across C6 and the gate voltage $V_G$ remain at a stable, relatively constant level. These stable voltages produce a stable current I1, which accurately corresponds to an estimate of the slope for the voltage $V_{SNS}(t)$ and the current $I_{LS}$.

If the voltage V4 is higher than the voltage V3 as occurs, e.g., immediately after time t2 when the slope estimation is first initialized, a positive voltage difference $V_{DIFF}$ is applied to the inputs of the transconductance amplifier 436. This produces a positive current $I_{SLOPE\_ERR}$ that charges the gate capacitance of Q1 and increases its gate voltage $V_{GS}$, thereby increasing the current I1 and its mirrored equivalents. The resultant increased current $I_{C4}$ reduces the voltage V4 until it matches and tracks V3.

Conversely, if the voltage V4 is lower than the voltage V3 as may occur, e.g., if the feedback loop overcorrects the slope estimate, a negative voltage difference $V_{DIFF}$ is applied to the inputs of the transconductance amplifier 436. This produces a negative current $I_{SLOPE\_ERR}$ that discharges the gate capacitance of Q1 and decreases its gate voltage $V_{GS}$, thereby decreasing the current I1 and its mirrored equivalents. The resultant decreased current $I_{C4}$ slows the rate at which the voltage V4 is reduced, such that it accurately tracks V3.

As illustrated, the current-setting transistor Q1 and the mirror transistors M1a, M1b are n-channel MOSFETS, and the mirror transistors M2a, M2b, M2c are p-channel MOSFETs, but other switch types may be used. For example, junction field-effect transistors (JFETs), insulated gate bipolar transistors (IGBTs), high electron mobility transistors (HEMTs), or other types of power transistors may be preferred in some configurations of the slope estimation circuit 430.

The closed-loop feedback configuration using the transconductance amplifier 436 and related components provides an accurate estimate of the slope of the sensed voltage $V_{SNS}$, which is related to the inductor current $I_{IND}$ according to the on-resistance $R_{DS\_ON}$ of the low-side power switch LS. This estimated slope is output from the slope estimation circuit 430 as the current I3.

During intervals outside of the non-blanked conduction interval during which the slope is being estimated, the feedback loop may be disabled so that a valid slope estimate is available at other times. For example, the switch 438 could be used to disable the gate of the current-mirror transistor M1a. The timing control signal PH7, which is the same as the timing signal PH3 except that PH7 is activated after a settling time of the voltage across capacitor C3, controls the switch 438.

The combiner and slope-based correction circuit 470A combines voltage samples provided by the voltage sampler circuits 440, 460, and the slope estimation I3 provided by the slope estimator 430. The voltage sampler circuit 440 samples the sensed voltage $V_{SNS}$ at time t2 to provide the voltage V1, whereas the voltage sampler circuit 460 samples the sensed voltage $V_{SNS}$ at time t3 to provide the voltage sample V2. These voltages V1, V2 are held, respectively, by the hold capacitors C1, C2. A switch 471 enables the slope estimation current I3 to the capacitor C1 according to the timing signal PH6. As shown in FIG. 3, the timing signal for PH6 is active beginning at time t3 and lasts for the blanking interval $t_{BLANK}$. Hence, the slope estimation current I3 charges the capacitor C1 for the blanking interval $t_{BLANK}$, thereby increasing the voltage V1 across the capacitor C1, as shown in waveform 230 of FIG. 2. The resultant voltage, e.g., V1 at time $t3+t_{BLANK}$, approximates the expected sensed voltage $V_{SNS}$ at time t1, labeled V0 in FIG. 2, if the ringing and related artifacts had not corrupted the sensed voltage.

For the described timings, the capacitances of the capacitors C1, C4 are substantially the same. The capacitances for capacitors C3, C2, and C5 are chosen to allow adequate time for their charging, and such that they are able to hold their charge for an adequate interval of time.

At the end of the low-side conduction time, e.g., at time t3 in FIGS. 2 and 3, the voltages V1 and V2 may be averaged to provide an accurate representation of the sensed voltage $V_{SNS}$ over the entire low-side conduction interval. The voltage V1 has effectively been corrected using the slope estimation current I3. Voltage followers 472, 474 buffer the voltages V1, V2 and provide them to switches 476, 477. The timing signal PH5 latches these voltages onto capacitor C5 at some time after t3, such that the voltage across capacitor C5 is an average of the voltages V1, V2. (The latching onto C5 should occur after the sampled voltage V2 has settled and the voltage V1 has reached its steady-state, but otherwise this timing is somewhat flexible.) A voltage follower 478 buffers the resultant average and provides it to an analog-to-digital converter (ADC) 480. In some implementations, the voltage follower 478 may be configured as an amplifier that provides a voltage range customized to the input range of the ADC 480. The ADC provides a digital signal $V_{SNS\_AVG}$ that represents an average voltage of $V_{SNS}$ during the low-side conduction interval, e.g., between times t2 and t3. Note that this average voltage for the low-side conduction interval may also be used as representative of the entire switching cycle, including the high-side conduction interval. The digital signal $V_{SNS\_AVG}$ may be modified to compensate for the voltage offset and amplification provided by the voltage sensor 410. After such modification/compensation, the resultant signal may be used, together with the on-state resistance $R_{DS\_ON}$ of the low-side power switch LS, to estimate the current D in the switching voltage converter 110.

Note that the particular timings described above and shown in FIGS. 2 and 3 may be modified and still achieve the same, or similar, results. For example, the timing signal PH6 could be pulsed at any time after time t2, provided adequate time is available to allow for the charging of capacitor C1 before the voltage V1 is latched by timing signal PH5.

As described above, an average of the sensed voltage $V_{SNS}$ is determined by taking a sample V1 at a time that is $t_{BLANK}$ after time t3. This sample V1(t3+$t_{BLANK}$) is then compensated (corrected) using the slope estimation 13. The compensated version of V1 is averaged with a sample V2 taken at time t3, corresponding to the end of the low-side conduction interval. The resultant average provides a good estimate of the average of the sensed voltage $V_{SNS}$. In an alternative technique, voltage samples V1, V2 obtained, respectively, at t2 and t3 are first averaged, and then a compensation (correction) is applied. Such an alternative technique may be implemented using the circuitry 400B of FIG. 4B.

FIG. 4B illustrates current estimation circuitry 400B, which is very similar to the current estimation circuitry 400A of FIG. 4A. Only those circuits that are significantly different are described below.

The combiner and slope-based correction circuit 470B inputs voltage samples V1, V2 that are captured by the sampling circuits 440, 460. However, the voltage across the capacitor C1 is not increased by a slope estimation current I1, as in FIG. 4A. Instead, the capacitor C1 merely holds the voltage sample V1. Voltage followers 472, 474 and sampling circuits 476, 477 provide an average of the voltages V1, V2 onto the capacitor C5, in much the same manner as described above. However, the voltage sample V1 that is provided in this average has not been compensated (corrected), as in FIG. 4A.

The combiner and slope-based correction circuit 470B includes a summing amplifier 479, which adds a correction factor to the average of the voltages V1 and V2. The slope estimation current I3 is fed to a resistor R8, so as to generate a correction $V_{CORR}$=I3*R8. This correction factor compensates for the fact that the voltage sample V1 is less than an expected sensed voltage $V_{SNS}$ at time t2, if not for the ringing and related artifacts. Once the correction factor $V_{CORR}$ is added to the initial average of V1 and V2, the resulting voltage, i.e., the output of the amplifier 479, is provided to ADC 480. The fourth waveform 240 of FIG. 2 shows the resultant voltage, wherein an uncompensated average voltage (V1+V2)/2 is determined at (or after) time t3, and is compensated with a voltage correction $V_{CORR}$.

The output of the amplifier 479 provides a voltage that is similar to that provided by the voltage follower 478 of FIG. 4A. As described in relation to FIG. 4A, the amplifier 479 may be configured to provide an amplified or attenuated voltage having a range matched to the expected input range of the ADC 480.

Another minor difference between FIGS. 4A and 4B is that the gating switch 471 is not needed in the circuitry 400B.

Figure 5A:
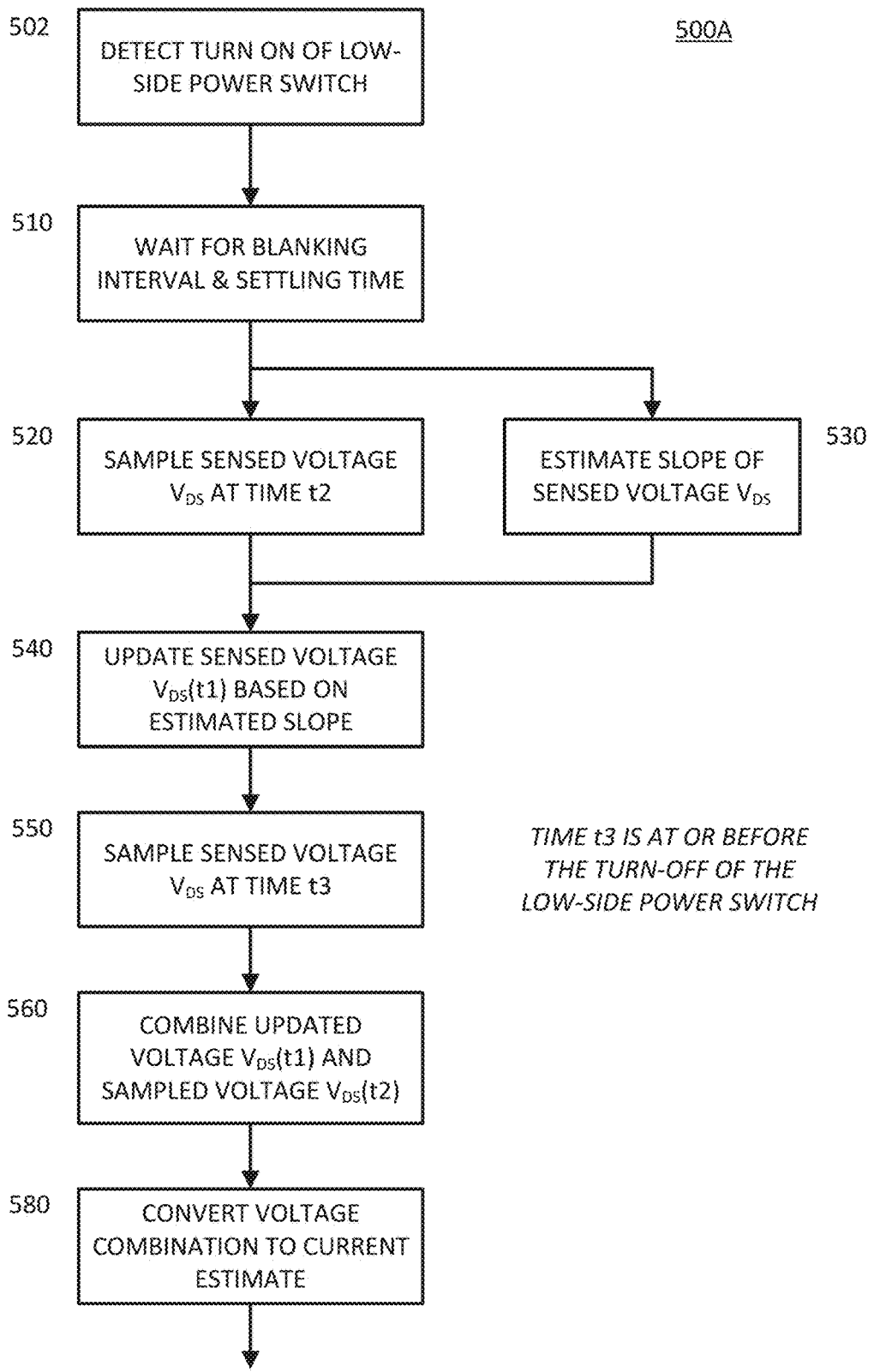
FIGS. 5A and 5B illustrate methods for estimating current using the on-state resistance of a power switch in a switching voltage converter.
Figure 5B:
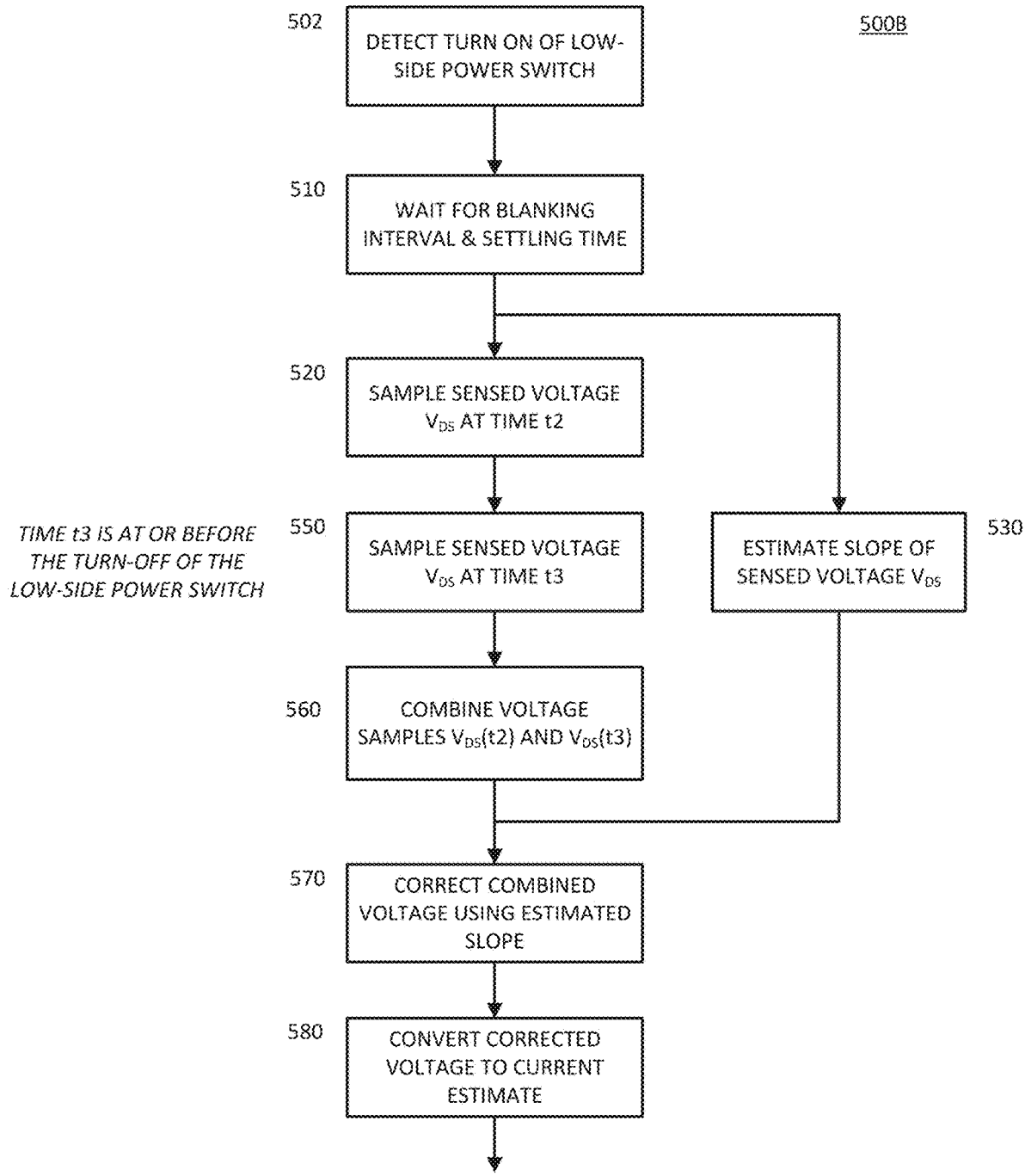

FIGS. 5A and 5B illustrate embodiments of methods 500A, 500B for estimating current in an an inductor of a switching voltage converter. These methods may be implemented within current estimation circuits, such as those shown in FIGS. 4A and 4B, and/or within a controller of the switching voltage converter. The illustrated methods represent examples and it should be understood that the step ordering may be rearranged to achieve the same effect, e.g., steps shown in series may be swapped or performed in parallel, where the context and data dependencies allow this. Furthermore, the illustrated methods do not preclude additional steps.

The method 500A begins with a step of detecting 502 the turn-on of a low-side switch, such as the low-side switch LS of FIG. 1. After waiting 510 for a blanking interval, which allows time for a voltage $V_{DS}$ across the low-side switch to settle, the voltage $V_{DS}$ across the low-side switch LS, or a sensed voltage corresponding to such voltage, is sampled 520 at a time t2. Also after the blanking interval, a slope of the voltage $V_{DS}$, or of a corresponding sensed voltage, is estimated 530. The voltage sampled at time t2 is updated 540 based upon the estimated slope. The voltage $V_{DS}$, or a sensed voltage thereof, is again sampled 550 at time t3, wherein the time t3 is after time t2, and is preferably aligned with a turn-off transition of the low-side switch LS. The updated version of the voltage sampled at time t2 is combined 560 with the voltage sample taken at time t3. The resultant combination is then converted 580 into an estimate of the current $I_{LS}$ in the low-side switch LS, which also corresponds to the current output from the switching voltage converter.

The method 500B of FIG. 5B is similar to the method 500A of FIG. 5A, and only the differences are described below. Unlike the method 500A, the voltage sample taken 520 at time t2 is not updated. The voltage samples taken at times t2 and t3 are combined 560, but the resultant combination does not use the slope estimation. Subsequent to the combination 560, the estimated slope is used to correct 570 the combined voltage.

The above methods describe that the voltage samples are taken at time instants corresponding to a blanking interval after the turn-on transition of a low-side switch LS, and at the turn-off transition of such switch. It should be recognized that these samples need not be at these exact time instants, and may instead be elsewhere within the LS conduction interval between the blanking interval and the turn-off transition. Furthermore, the slope estimation may be performed during the entirety or during a portion of such a conduction interval. While the slope estimation may be performed within this interval, the slope estimation may be retained and used afterwards.

Figure 6:
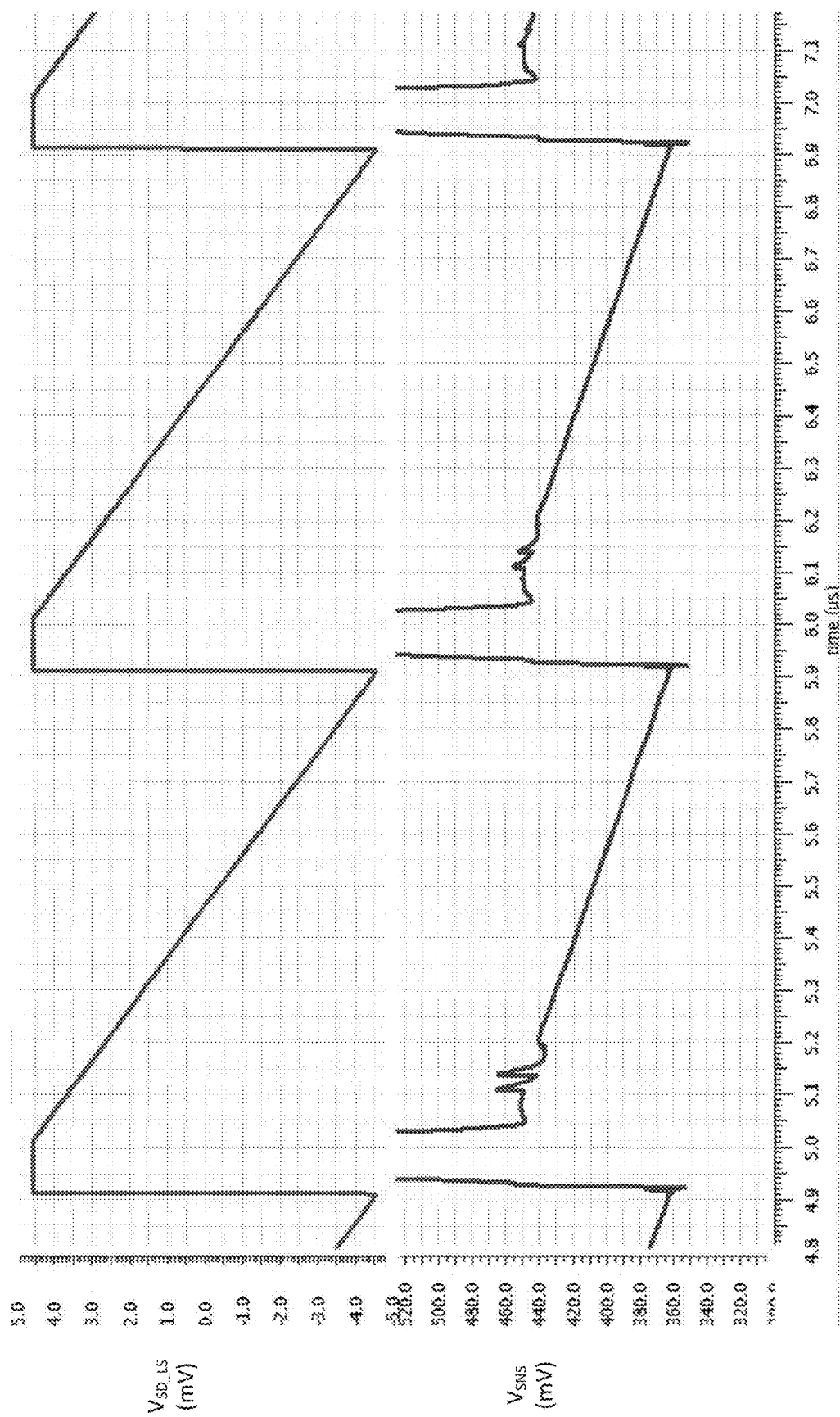
FIG. 6 illustrates waveforms corresponding to a voltage across a power switch and to an amplified and inverted version thereof.

FIG. 6 illustrates waveforms for the source-to-drain voltage $V_{SD\_LS}$ of the low-side switch LS and a corresponding sensed voltage $V_{SNS}$, as output from the amplifier 412. These waveforms correspond to slightly over two switching cycles of the voltage converter 100.

Figure 7:
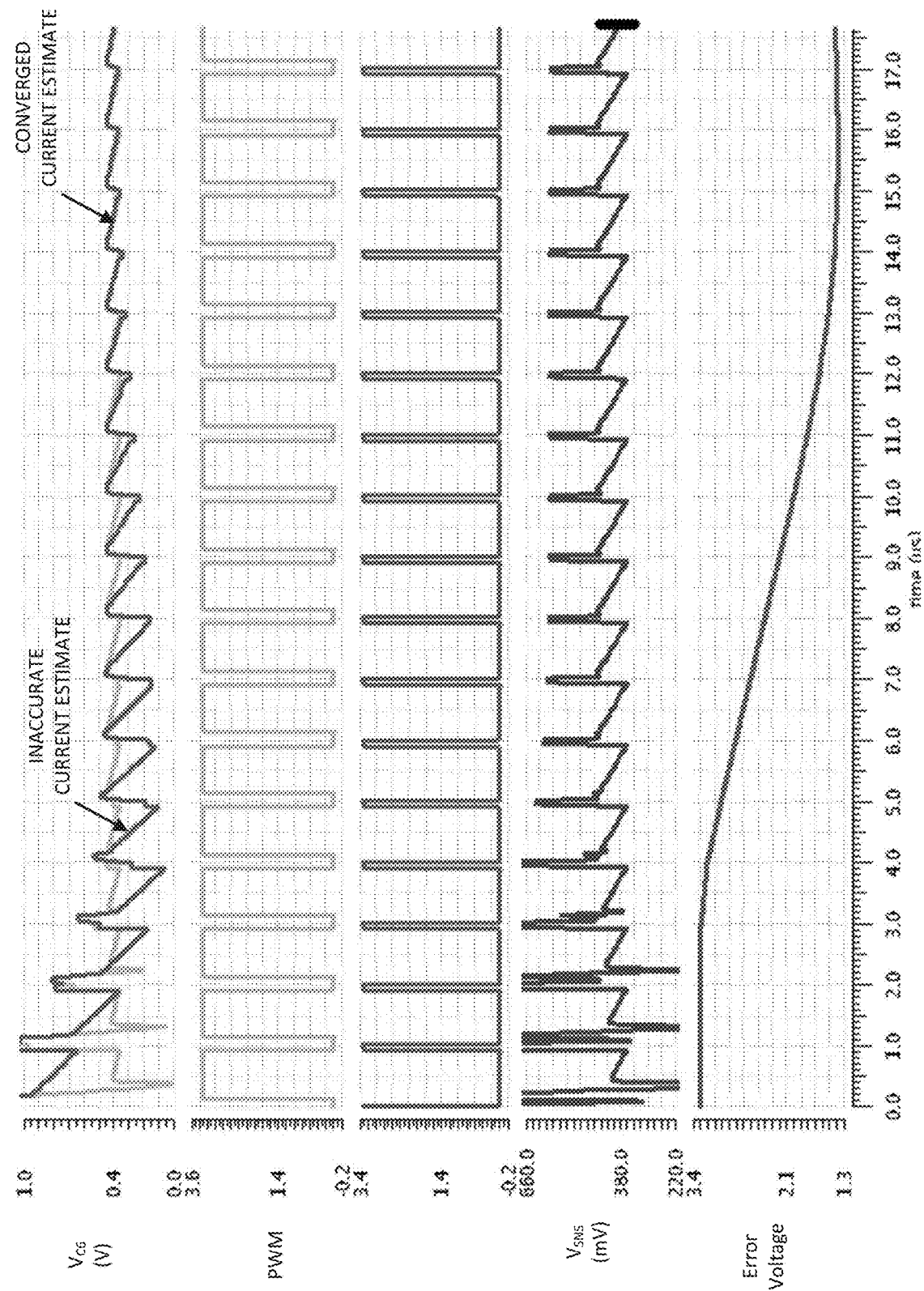
FIG. 7 illustrates waveforms corresponding to slope error signals over several switch cycles of a voltage converter, and to convergence of such error signals.

FIG. 7 illustrates waveforms that show the convergence of the slope estimate using the circuitry and/or techniques described above. These waveforms correspond to a transient response of a switching voltage converter, and resulting waveforms for the slope estimation. The convergence of the slope estimation takes several switching cycles of the voltage converter.

For clarity of explanation, the above descriptions have focused on examples wherein the output current of a switching voltage converter is estimated using measurements taken across a low-side power switch. The described techniques may be extrapolated to use measurements taken across a high-side power switch within a switching voltage converter. The output current, e.g., the current through an inductor of a switching voltage converter, may be estimated using measurements taken across a low-side switch LS, as described in detail above, across a high-side switch HS, or based upon measurements taken across both high and low-side switches.

Although the present disclosure is not so limited, the following numbered examples demonstrate one or more aspects of the disclosure.

Example 1. According to an embodiment of a current estimation circuit, the current estimation circuit is configured to estimate current in a power switch during a conduction interval of the power switch. The power switch is typically part of a switching power converter, and the estimated current corresponds to, and may be equivalent to, an output current of the switching power converter. The current estimation circuit includes a slope estimator and a sampler circuit. The slope estimator is configured to estimate a slope representative of the current in the power switch during a portion of the conduction interval that begins at or after a first delay from a turn-on transition of the power switch. The sampler circuit is configured to generate a first sample, which corresponds to a first sensed voltage across the power switch at or after the first delay from the turn-on transition, and to generate a second sample, which corresponds to a second sensed voltage across the power switch, which is after the first sensed voltage. The current estimation circuit is configured to estimate current in the power switch over the conduction interval based on the first sample, the second sample, and the estimated slope.

Example 2. The current estimation circuit of example 1, further comprising an updating circuit. The updating circuit is coupled to the slope estimator and the sampler circuit, and is configured to generate a third sample based upon the first sample and the estimated slope. The current estimate is based on a combination of the second sample and the third sample.

Example 3. The current estimation circuit of example 2, wherein the first sensed voltage corresponds to a first time instant and the second sensed voltage corresponds to a second time instant. The updating circuit comprises a first voltage node, which is initialized with a voltage corresponding to the first sample, and whose voltage is increased based upon the estimated slope for a time interval starting after the first time instant and lasting for the delay time.

Example 4. The current estimation circuit of example 1, wherein a preliminary current estimate is based on a combination of the first sample and the second sample, and the preliminary current estimate is updated based on the slope estimate to yield the current estimate.

Example 5. The current estimation circuit of example 4, wherein the combination of the first and second samples is generated by latching the first and second samples, such that the preliminary estimate is an average of the first and second samples, and wherein the current estimation circuit comprises a summing amplifier configured to sum the average with a correction factor that is based on the estimated slope and the first delay.

Example 6. The current estimation circuit of example 1, further comprising a voltage sensor configured to sense a voltage across load terminals of the power switch during the conduction interval, and to provide the sensed voltage, or a variant thereof, to the sampler circuit and the slope estimator.

Example 7. The current estimation circuit of example 1, wherein the slope estimator comprises an amplifier, a first input switch, and a second input switch. The amplifier has a first amplifier input, a second amplifier input, and an amplifier output. A current at the amplifier output corresponds to an error in the slope estimate. The first input switch is configured to couple a sensed voltage across the power switch to the first amplifier input during a portion of the conduction interval that begins at or after the first delay from the turn-on transition. The second input switch is configured to output an initial amplifier sample to the second amplifier input, the initial amplifier sample based upon sampled sensed voltage at a time instant at or after the first delay from the turn-on transition of the power switch.

Example 8. The current estimation circuit of example 7, wherein the slope estimator comprises a feedback circuit that couples a signal corresponding to the estimated slope to the second amplifier input.

Example 9. The current estimation circuit of example 7, wherein the slope estimator comprises a current-setting transistor having a control terminal coupled to the amplifier output, and wherein a current in the current-setting transistor corresponds to the estimated slope.

Example 10. The current estimation circuit of example 9, wherein the slope estimator comprises a current mirror configured to mirror the current in the current-setting transistor, and wherein the mirrored current provides the estimated slope that is used to estimate the current in the power switch.

Example 11. According to an embodiment of a power conversion system, the power conversion system includes a switching voltage converter and a current estimation circuit. The switching voltage converter includes a power switch and an inductor. The current estimation circuit of the power conversion system is configured and includes components as described in example 1.

Example 12. The voltage conversion system of example 11, wherein the current estimation circuit further comprises a voltage sensor configured to sense a voltage across the load terminals of the power switch during the conduction interval, and to provide the sensed voltage, or a variant thereof, to the sampler circuit and the slope estimator.

Example 13. The voltage conversion system of example 11, wherein the switching voltage converter is a buck converter, the power switch is a low-side switch of the buck converter, and the buck converter further comprises a high-side switch.

Example 14. The voltage conversion system of example 13, wherein the estimated current in the inductor is based upon the estimated slope, and wherein the estimated slope corresponds to a current in the low-side switch when the low-side switch is conducting.

Example 15. According to an embodiment of a method, the method is for estimating current in a power switch having a switch voltage between first and second load terminals of the power switch. The method comprises turning on the power switch at a turn-on transition, and turning off the power switch at a turn-off transition. The method further comprises estimating a slope that is representative of the current in the power switch between a first time instant, which is a first delay after the turn-on transition, and a second time instant, which is after the first time instant and at or before the turn-off transition. The method includes sampling the switch voltage at a first sample time that is at or after the first delay after the turn-on transition, resulting in a first sampled voltage, and sampling the switch voltage at a second sample time that is after the first sample time and at or before the turn-off transition, resulting in a second sampled voltage. The method additionally includes outputting an estimated current based on the first sampled voltage, the second sampled voltage, and the estimated slope.

Example 16. The method of example 15, further comprising updating the first sampled voltage based on the estimated slope, and combining the second sampled voltage and the updated first sampled voltage to generate the estimated current.

Example 17. The method of claim 15, further comprising generating a preliminary current estimate based on a combination of the first sampled voltage and the second sampled voltage, and updating the preliminary current estimate based on the slope estimate and the first delay to generate the estimated current.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A current estimation circuit for estimating current in a power switch during a conduction interval of the power switch, comprising:
   a slope estimator configured to estimate a slope representative of the current in the power switch during a portion of the conduction interval that begins at or after a first delay from a turn-on transition of the power switch; and
   a sampler circuit configured to generate a first sample, which corresponds to a first sensed voltage across the power switch at or after the first delay from the turn-on transition, and to generate a second sample, which corresponds to a second sensed voltage across the power switch, which is after the first sensed voltage,
   wherein the current estimation circuit is configured to estimate current in the power switch over the conduction interval based on the first sample, the second sample, and the estimated slope.

2. The current estimation circuit of claim 1, further comprising:
   an updating circuit coupled to the slope estimator and the sampler circuit, and configured to generate a third sample based upon the first sample and the estimated slope,
   wherein the current estimate is based on a combination of the second sample and the third sample.

3. The current estimation circuit of claim 2,
   wherein the first sensed voltage corresponds to a first time instant and the second sensed voltage corresponds to a second time instant;
   wherein the updating circuit comprises a first voltage node, which is initialized with a voltage corresponding to the first sample, and whose voltage is increased based upon the estimated slope for a time interval starting after the first time instant and lasting for the first delay.

4. The current estimation circuit of claim 1, wherein a preliminary current estimate is based on a combination of the first sample and the second sample, and the preliminary current estimate is updated based on the slope estimate to yield the current estimate.

5. The current estimation circuit of claim 4, wherein the combination of the first and the second samples is generated by latching the first and second samples, such that the preliminary estimate is an average of the first and second samples, and wherein the current estimation circuit comprises a summing amplifier configured to sum the average with a correction factor that is based on the estimated slope and the first delay.

6. The current estimation circuit of claim 1, further comprising:
   a voltage sensor configured to sense a voltage across load terminals of the power switch during the conduction interval, and to provide the sensed voltage, or a variant thereof, to the sampler circuit and the slope estimator.

7. The current estimation circuit of claim 1, wherein the slope estimator comprises:
   an amplifier having a first amplifier input, a second amplifier input, and an amplifier output, wherein a current at the amplifier output corresponds to an error in the slope estimate;
   a first input switch configured to couple a sensed voltage across the power switch to the first amplifier input during the portion of the conduction interval that begins at or after the first delay from the turn-on transition; and
   a second input switch configured to output an initial amplifier sample to the second amplifier input, the initial amplifier sample based upon a sampled sensed voltage at a time instant at or after the first delay from the turn-on transition of the power switch.

8. The current estimation circuit of claim 7, wherein the slope estimator comprises a feedback circuit that couples a signal corresponding to the estimated slope to the second amplifier input.

9. The current estimation circuit of claim 7, wherein the slope estimator comprises a current-setting transistor having a control terminal coupled to the amplifier output, and wherein a current in the current-setting transistor corresponds to the estimated slope.

10. The current estimation circuit of claim 9, wherein the slope estimator comprises a current mirror configured to mirror the current in the current-setting transistor, and wherein the mirrored current provides the estimated slope that is used to estimate the current in the power switch.

11. The current estimation circuit of claim 1, wherein the first delay includes a blanking interval, wherein a slope of a voltage across load terminals of the power switch is monotonic in an interval after the blanking interval and prior to a turn-off transition of the power switch.

12. A power conversion system, comprising:
a switching voltage converter having a power switch and an inductor, the power switch comprising a first load terminal and a second load terminal;
a current estimation circuit for estimating current in the power switch during a conduction interval of the power switch, comprising:
 a slope estimator configured to estimate a slope representative of the current in the power switch during a portion of the conduction interval that begins at or after a first delay from a turn-on transition of the power switch; and
 a sampler circuit configured to generate a first sample, which corresponds to a first sensed voltage across the power switch at or after the first delay from the turn-on transition, and to generate a second sample, which corresponds to a second sensed voltage across the power switch, which is after the first sensed voltage,
 wherein the current estimation circuit is configured to estimate current in the power switch over the conduction interval based on the first sample, the second sample, and the estimated slope.

13. The power conversion system of claim 12, wherein the current estimation circuit further comprises:
a voltage sensor configured to sense a voltage across the load terminals of the power switch during the conduction interval, and to provide the sensed voltage, or a variant thereof, to the sampler circuit and the slope estimator.

14. The power conversion system of claim 12, wherein the switching voltage converter is a buck converter, the power switch is a low-side switch of the buck converter, and the buck converter further comprises a high-side switch.

15. The power conversion system of claim 14, wherein the estimated current in the inductor is based upon the estimated slope, and wherein the estimated slope corresponds to a current in the low-side switch when the low-side switch is conducting.

16. A method for estimating current in a power switch having a switch voltage between first and second load terminals of the power switch, the method comprising:
turning on the power switch at a turn-on transition;
turning off the power switch at a turn-off transition;
estimating a slope representative of the current in the power switch between a first time instant, which is a first delay after the turn-on transition, and a second time instant, which is after the first time instant and at or before the turn-off transition;
sampling the switch voltage at a first sample time that is at or after the first delay after the turn-on transition, resulting in a first sampled voltage;
sampling the switch voltage at a second sample time that is after the first sample time and at or before the turn-off transition, resulting in a second sampled voltage;
outputting an estimated current based on the first sampled voltage, the second sampled voltage, and the estimated slope.

17. The method of claim 16, further comprising:
updating the first sampled voltage based on the estimated slope; and
combining the second sampled voltage and the updated first sampled voltage to generate the estimated current.

18. The method of claim 16, further comprising:
generating a preliminary current estimate based on a combination of the first sampled voltage and the second sampled voltage; and
updating the preliminary current estimate based on the slope estimate and the first delay to generate the estimated current.

* * * * *